United States Patent [19]
Iida

[11] Patent Number: 5,732,332
[45] Date of Patent: Mar. 24, 1998

[54] TRANSMITTER HAVING TEMPERATURE-COMPENSATED DETECTOR

[75] Inventor: Sachio Iida, Chiba, Japan

[73] Assignee: Sony Corporation, Tokyo, Japan

[21] Appl. No.: 644,250

[22] Filed: May 10, 1996

[30] Foreign Application Priority Data

May 31, 1995 [JP] Japan .................................. 7-134526

[51] Int. Cl.$^6$ .................................................. H04B 1/04
[52] U.S. Cl. ........................................ 455/117; 455/126
[58] Field of Search .................................. 455/126, 127, 455/115, 117; 330/289

[56] References Cited

U.S. PATENT DOCUMENTS

| | | | |
|---|---|---|---|
| 4,000,472 | 12/1976 | Eastland | 329/204 |
| 4,319,196 | 3/1982 | Kwan | 455/337 |
| 5,659,253 | 8/1997 | Busking | 455/126 |

*Primary Examiner*—Reinhard J. Eisenzopf
*Assistant Examiner*—Edan Orgad

[57] ABSTRACT

A temperature compensated detector includes a series circuit formed by successively connecting a first resistor, a first diode, a second diode having a characteristic substantially equal to that of the first diode, and a second resistor, a third resistor, and a fourth resistor. A terminal supplied with a predetermined bias voltage is grounded through the series circuit. A high-frequency signal to be detected is supplied to a junction point between the first resistor and the first diode or a junction point between the second diode and the second resistor. A detected signal is derived from a junction point between the third resistor and the fourth resistor which are respectively connected to both ends of the second diode or the first diode to divide a voltage.

8 Claims, 6 Drawing Sheets

TRANSMITTER HAVING TEMPERATURE-COMPENSATED DETECTOR

BACKGROUND OF THE INVENTION

1. Field of the Invention

The present invention relates to a detector suitable for application to a transmission circuit of a radio telephone apparatus, and a transmitter employing the detector.

2. Description of the Related Art

There is generally available a radio transmitter which detects a level of a transmission signal (high-frequency signal) transmitted from an antenna by wireless and controls an amplification factor of the transmission signal so that the detected level is constant, thereby setting the level of the transmission signal constant. A general detector used in such transmitter to detect the level of the transmission signal is arranged as shown in FIG. 1, for example. In order to detect a high-frequency signal with a comparatively low level, the detector is arranged such that a bias current flows into a detection diode. The transmission signal which is a signal to be detected is supplied through an input terminal 1 and a capacitor 2 to an anode of a detection diode 3. The capacitor 2 serves as a bypass capacitor which prevents a DC signal from passing therethrough and allows only a high-frequency component to pass therethrough. One end of a choke coil 4 is connected to a junction point between the capacitor 2 and the diode 3. The other end of the choke coil 4 is connected to a bias-signal input terminal 5 at which a bias signal having a predetermined voltage is obtained.

A cathode of the detection diode 3 is connected to one end of a resistor 6. A junction point between the diode 3 and the resistor 6 is grounded through a parallel circuit formed of a bypass capacitor 7 and a resistor 8. In this case, the resistor 8 is used to determine a forward bias current of the diode 3.

The other end of the resistor 6 is connected to a detected-signal output terminal 9. A junction point between the resistor 6 and the output terminal 9 is grounded through a capacitor 10. The capacitor 10 is a smoothing capacitor. The resistor 6 and the capacitor 10 form an integrator.

An operation of the detector thus arranged will be described. When the high-frequency signal is not supplied to the input terminal 1, the bias signal supplied from the bias-signal input terminal 5 flows through a path formed of the choke coil 4, the diode 3 and the resistor 8. Its bias current is determined as a quotient of a voltage obtained by subtracting a forward voltage VF of the diode 3 from a bias voltage Vb and a resistance value of the resistor 8.

When the high-frequency signal having a low level is supplied to the input terminal 1, the high-frequency signal passes through the bypass capacitor 2. The diode 3 is applied with a voltage obtained by adding the forward voltage VF and a high-frequency signal voltage Vin. Since a conductance of the diode 3 is changed at an exponential rate with respect to the voltage, an instantaneous current flowing through the diode 3 becomes asymmetric because the instantaneous current during a positive half cycle of the input high-frequency signal is different from that during a negative half cycle thereof. As a result, a mean current is increased in the positive direction, thereby a DC component being produced.

A high-frequency component of the instantaneous current flows through the bypass capacitor 7 to a ground side. The DC component supplied from the bias-signal input terminal 5 flows through the choke coil 4, the diode 3 and the resistor 8 to the ground side. The DC component increases a voltage at an I point which is the junction point located on the side of the cathode of the diode 3. An envelope signal integrated by the resistor 6 and the capacitor 10 is obtained at the output terminal 9.

A detection characteristic of the detector having such arrangement is disadvantageously influenced by a temperature fluctuation. Specifically, the conductance of the diode 3 in the circuit shown in FIG. 1 is a quotient of a forward current if and a thermoelectric voltage Vt, both of which are fluctuated depending upon the temperature fluctuation and consequently have negative temperature coefficients. A voltage at the output terminal 9 is a sum of a DC offset voltage having a positive temperature coefficient and a detected-signal voltage having a negative temperature coefficient. However, a detected output signal of the high-frequency signal having a low level is smaller than or substantially equal to a temperature drift of the DC offset voltage. Consequently, the output signal of the detected high-frequency signal is fluctuated depending upon the temperature fluctuation.

If a detection level of an envelope is fluctuated depending upon the temperature fluctuation as described above, then when the detector detects the level of the transmission signal to control the transmission output, a control state of the transmission output is fluctuated in response to the temperature, which leads to an unsatisfactory control state.

SUMMARY OF THE INVENTION

In view of such aspects, it is an object of the present invention to carry out an accurate detection, free from influence of a temperature fluctuation, by using a detector described above and to provide a transmitter having a detector capable of carrying out an accurate detection free from any influence of the temperature fluctuation.

According to a first aspect of the present invention, a detector according to the present invention includes a series circuit formed by successively connecting a first resistor, a first diode, a second diode having a characteristic substantially equal to that of the first diode, and a second resistor, a third resistor, and a fourth resistor. A terminal supplied with a predetermined bias voltage is grounded through the series circuit. A high-frequency signal to be detected is supplied to a junction point between the first resistor and the first diode or a junction point between the second diode and the second resistor. An detected signal is derived from a junction point between the third resistor and the fourth resistor which are respectively connected to both ends of the second diode or the first diode to divide a voltage.

According to a second aspect of the present invention, a transmitter according to the present invention includes an amplifier circuit for amplifying a transmission signal, a detector connected to the amplifier circuit for monitoring a level of the transmission signal amplified by the amplifier circuit, and a control circuit connected to the amplifier circuit and the detector for controlling the amplifier circuit based on a detected signal from the detector. The detector for detecting the transmission signal is arranged as follows. The terminal supplied with a predetermined bias voltage is grounded through the series circuit formed by successively connecting the first resistor, the first diode, the second diode having a characteristic substantially equal to that of the first diode, and the second resistor. The transmission signal amplified by the amplifier circuit is supplied to the junction point between the first resistor and the first diode or the junction point between the second diode and the second resistor. The detected signal of the transmission signal is derived from the junction point between the third resistor and the fourth resistor which are respectively connected to both ends of the second diode or the first diode and divide the voltage.

According to the detector of the present invention, it is possible to temperature-compensate a detection characteristics of the detector by setting a ratio in which the third and fourth resistors divide the voltage so that fluctuation of a detected voltage resulting from temperature fluctuation should be canceled by fluctuation of a forward voltage of a diode, which does not detect the signal, resulting from the temperature fluctuation.

According to the transmitter of the present invention, it is possible to temperature-compensate the detection characteristics by setting a ratio in which the third and fourth resistors forming the detector divide the voltage so that fluctuation of the detected voltage resulting from temperature fluctuation should be canceled by fluctuation of a forward voltage of the diode, which does not detect the signal, resulting from the temperature fluctuation. It is possible to control the transmission output to be constant and free from fluctuation resulting from the temperature fluctuation.

DESCRIPTION OF THE PREFERRED EMBODIMENTS

Figure 1:
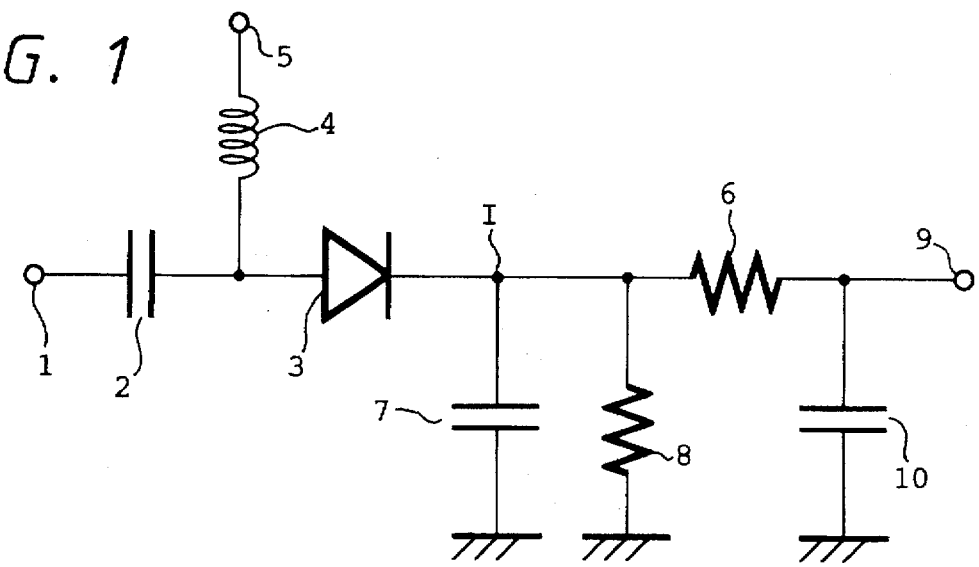
FIG. 1 is a diagram showing an example of a circuit arrangement of a general detector.

A detector according to a first embodiment of the present invention will hereinafter be described with reference to FIGS. 2 to 5.

In the first embodiment, the detector according to the present invention is applied to a transmission circuit for transmitting a high-frequency signal by wireless (i.e., the detector is applied to a transmission system of a transceiver formed as a radio telephone). An arrangement of the transmitter will be described with reference to FIG. 5 first. An audio signal and so on obtained by a microphone 51 is supplied to a baseband signal processing unit 52. The baseband signal processing unit 52 converts the supplied audio signal and so on into digital data, thereby obtaining transmission data having a slot arrangement. The baseband signal processing unit 52 supplies the transmission data to an orthogonal modulator 53.

The orthogonal modulator 53 subjects the transmission data to the orthogonal modulation by using a carrier wave output from an oscillator 54. The orthogonal modulator 53 carries out modulation which provides, for example, a π/4 shift differential quadrature phase shift keying (DQPSK) modulation signal.

The orthogonal modulator 53 outputs the modulated signal as a transmission signal to a power amplifier 55. The power amplifier 55 carries out power amplification at an amplification factor controlled by an output control circuit 59. The power amplifier 55 supplies the amplified transmission signal through a directional coupler 56 to a transmission antenna 57.

The directional coupler 56 is arranged such that a large part of the transmission signal supplied from the power amplifier 55 passes through a system 56a thereof connected to the antenna 57 and a part thereof is branched therefrom to another branch system 56b, and then supplied to an envelope detector 58. The directional coupler 56 permits a reflected wave from the antenna 57 side to flow toward a resister 56c connected to the branch system 56b to thereby prevent the reflected wave from being supplied to the envelope detector 58.

The envelope detector 58 detects an envelop of the supplied high-frequency signal and supplies a detected signal to the output control circuit 59. The output control circuit 59 controls the amplification factor used in the power amplifier 55 in response to a level of the supplied detected signal. Thus, the transmission output signal is controlled to have a constant transmission level.

Figure 2:
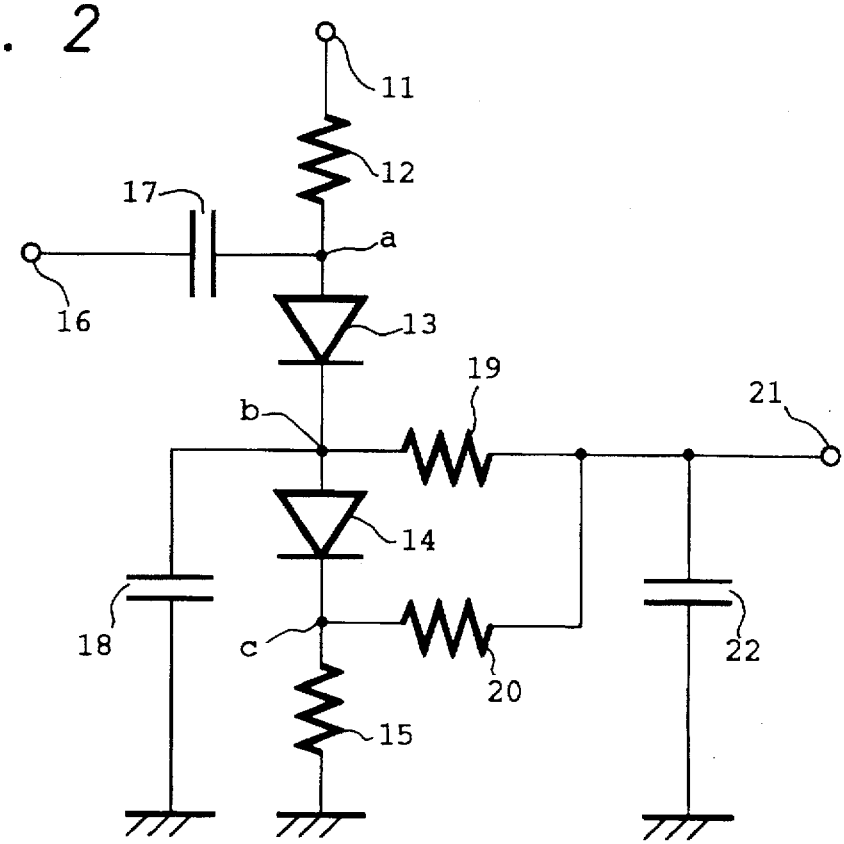
FIG. 2 is a diagram showing a circuit arrangement of a detector according to a first embodiment of the present invention.
Figure 3:
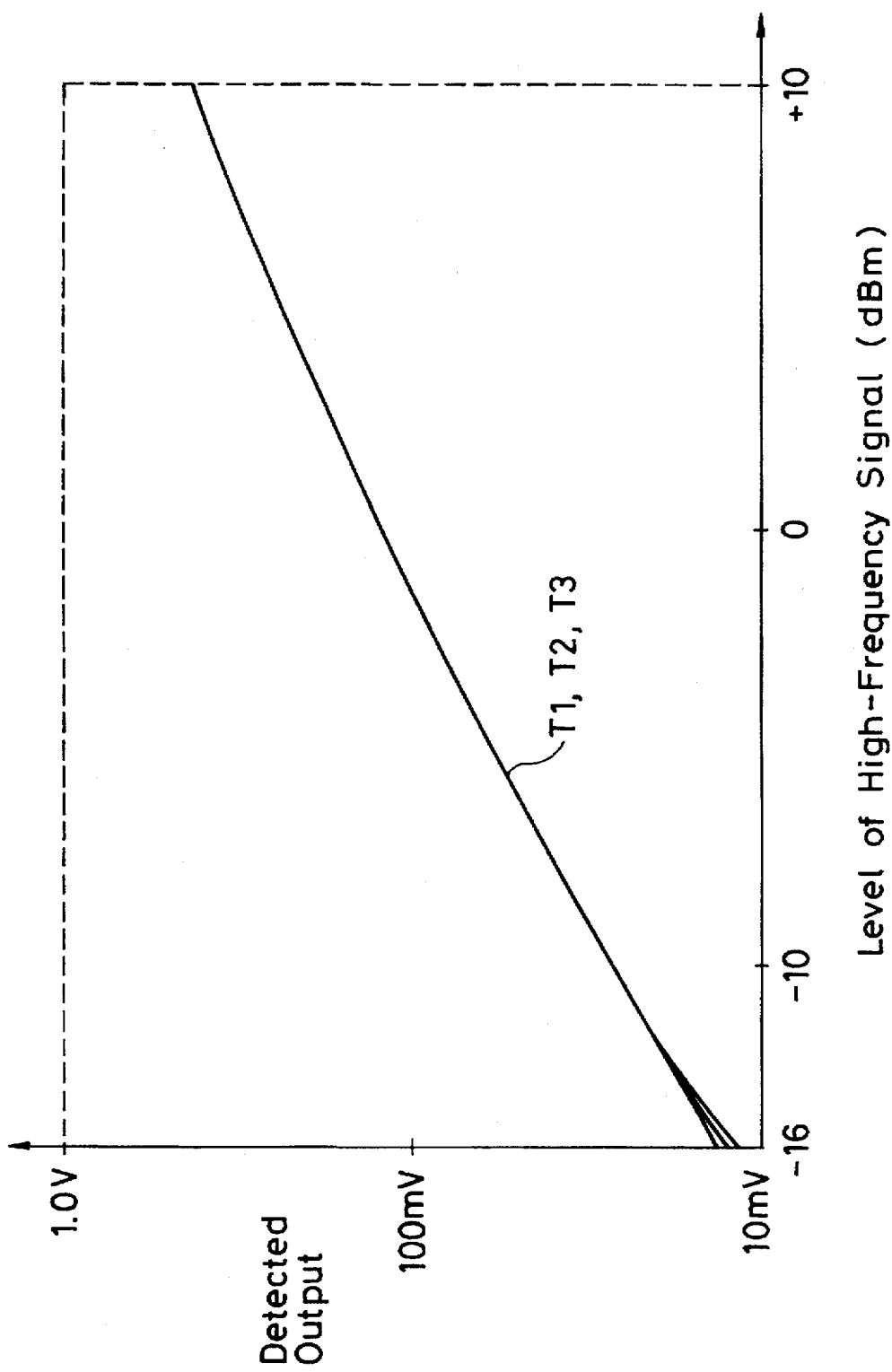
FIG. 3 is a graph showing a detection characteristic according to the first embodiment.

In this embodiment, the envelop detector 58 of the transmission circuit is arranged as shown in FIG. 2. A circuit arrangement of the envelope detector 58 will hereinafter be described. A bias signal having a predetermined voltage and obtained at a bias-signal input terminal 11 is supplied to one end of a resistor 12. The resistor 12 is connected at its other end to the anode of a diode 13. A cathode of the diode 13 is connected to an anode of a diode 14. A cathode of the diode 14 is connected to one end of a resistor 15. The other end of the resistor 15 is grounded. In this case, the resistor 12 and the resistor 15 are used for determining forward bias currents of the diodes 13, 14, and have the same resistance value. The diodes 13, 14 have the same characteristics. For example, a Schottky barrier diode in which two diodes are sealed in the same package is used as the two diodes 13, 14.

The high-frequency signal to be detected is supplied from a high-frequency signal input terminal 16 through a bypass capacitor 17 to a junction point a between the resistor 12 and the diode 13. In this case, the bypass capacitor 17 prevents a DC component from passing therethrough and allows only a high-frequency component to pass therethrough.

A junction point b between the diode 13 and the diode 14 is grounded through a bypass capacitor 18. The capacitor 18 serves as a bypass capacitor which prevents the high-frequency voltage to be supplied to the diode 13 from being supplied to the diode 14.

The junction point b between the diode 13 and the diode 14 is connected to one end of a resistor 19. A junction point c between the diode 14 and the resistor 15 is connected to one end of a resistor 20. The other end of the resistor 19 is connected to the other end of the resistor 20. A junction point between the resistors 19, 20 is connected to a detected-signal output terminal 21. The resistors 19, 20 serve as voltage dividing resistors which set a voltage dividing ratio capable of providing a smaller temperature coefficient as described later on. For example, if a bias voltage is 1V, a resistance value of the resistor 19 is set to 1 kΩ and a resistance value of the resistor 20 is set to 27 kΩ. The junction point between the resistors 19, 20 is grounded through a smoothing capacitor 22.

An operation of the detector thus arranged will be described. Initially, a circuit supplied with the bias signal will be described. If a sum of the resistance values of the resistors 19, 20 is considerably larger than a resistance value at an operation point of the diode 14, then when the high-frequency signal is supplied to the input terminal 16, a bias current flowing through the path formed by the resistor 12 through the diode 13 and the diode 14 to the resistor 15 is determined as a quotient of a voltage obtained by subtracting a forward voltage VF of the diodes 13, 14 from a bias voltage Vb and the sum of the resistance values of the resistors 12, 15.

Since the forward voltage VF of the diodes 13, 14 has a negative temperature coefficient, the bias current has a positive temperature coefficient. Accordingly, a value of a voltage at the junction point c between the diode 14 and the resistor 15 similarly has a positive temperature coefficient. Since the junction point b between the diode 13 and the diode 14 is a middle point of a series circuit formed of the resistors 12, 15 and the diodes 13, 14, a voltage at the junction point b has a half value of the bias voltage and hence is not changed. Since a DC offset voltage at the output terminal 21 has a value of a voltage obtained by respectively dividing voltages at the junction points b and c by the resistors 19, 20, the DC offset voltage has a positive temperature coefficient. It is possible to set the DC offset voltage by using a voltage dividing ratio provided by the resistors 19, 20 so as to have a small temperature coefficient.

A detecting operation of the detector will be described. When the high-frequency signal having a low level is input to the input terminal 16, the high-frequency signal passes through the bypass capacitor 17, thereby the diode 13 being applied with a voltage which is a sum of the forward voltage VF and a high-frequency voltage Vin. A conductance of the diode 13 is changed at an exponential rate with respect to the voltage. An instantaneous current flowing through the diode 13 becomes asymmetric because the instantaneous current during a positive half cycle of the input high-frequency signal is different from that during a negative half cycle thereof. As a result, a mean current is increased, thereby a DC component is produced.

A high-frequency component of the instantaneous current flows through the bypass capacitor 18 to a ground side.

The DC component supplied from the bias-signal input terminal 11 flows through the resistor 12, the diode 13, the diode 14 and the resistor 15 to the ground side. The DC component increases a voltage at the junction point b between the diode 13 and the diode 14. An envelope signal integrated by the resistor 19 and the capacitor 22 is obtained at the output terminal 21.

Conductances of the diodes 13, 14 are quotients of the forward current If and a thermoelectric voltage Vt. Both of the conductances are changed depending upon a temperature and have negative temperature coefficients. Since a detection efficiency is proportional to the conductances, the detection efficiency has a negative temperature coefficient similarly.

Since a voltage obtained at the output terminal 21 is a sum of the DC offset voltage having a positive temperature coefficient and a detection voltage having a negative temperature coefficient, the temperature fluctuation can be canceled by satisfactorily setting a voltage dividing ratio by the resistor 19 and the resistor 20.

Figure 4:
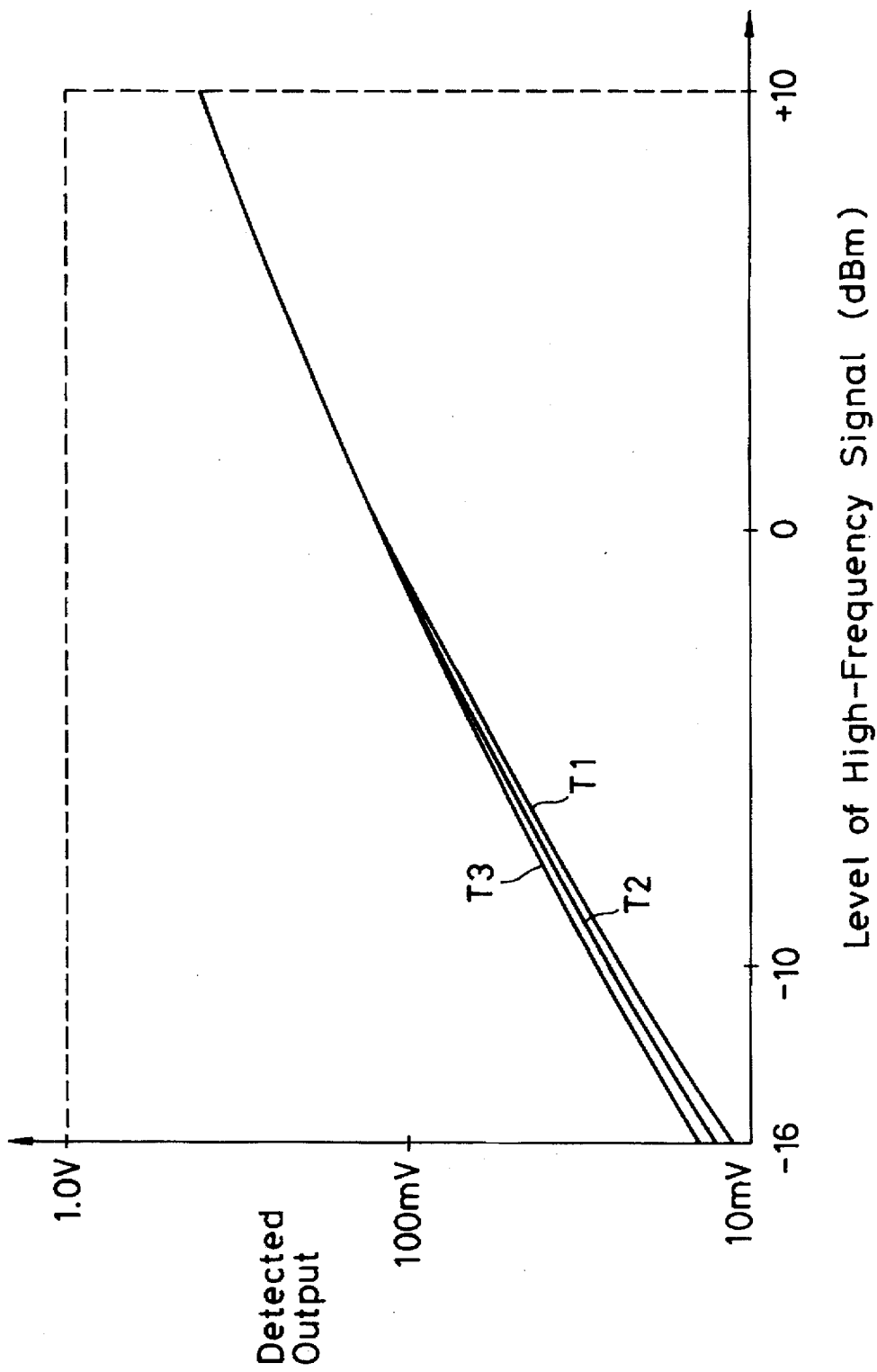
FIG. 4 is a graph showing a detection characteristic presented when a temperature compensation according to the first embodiment is not effected.
Figure 5:
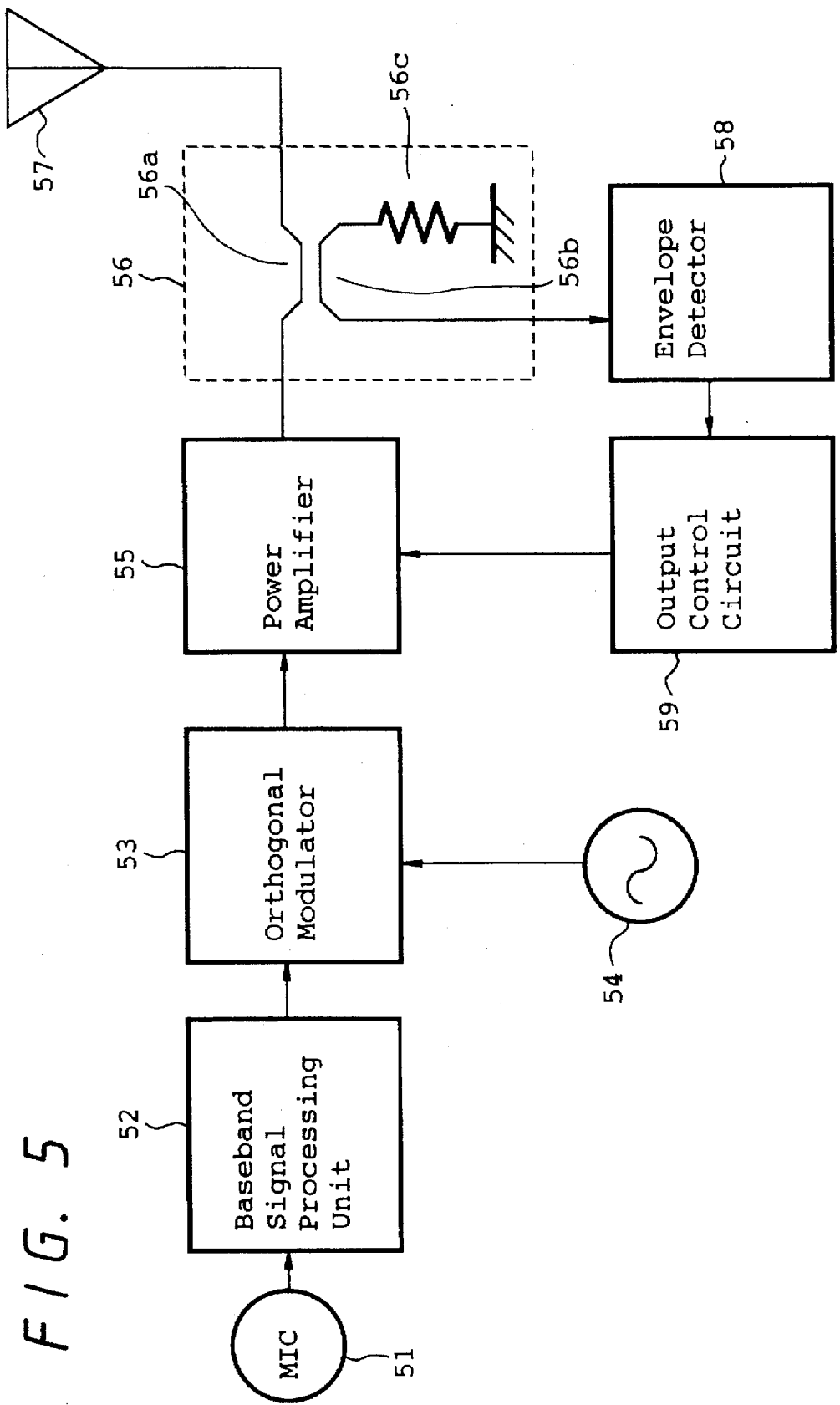
FIG. 5 is a diagram showing an arrangement of a transmission circuit to which the detector according to the first embodiment is applied.

Accordingly, according to a detector of the first embodiment, it is possible to obtain the satisfactory detected signal which is free from the influence of the temperature fluctuation. There will be compared two detection characteristics shown in FIGS. 3 and 4: the former is a detection characteristic of the detector formed of the circuit according to this embodiment (the circuit shown in FIG. 2); and the latter is a detection characteristic of the detector shown in FIG. 2 which does not have the resistor 20. When the detection characteristics T1, T2, T3 respectively obtained at 75° C., 25° C., -25° C. are measured by using the detector formed of the circuit according to the first embodiment, the detection characteristics T1, T2, T3 become substantially the same at most of levels of the input signal and are slightly different from one another only at the high-frequency signal level of -10dBm or smaller. On the other hand, when the detection characteristics T1, T2, T3 respectively obtained at 75° C., 25° C., -25° C. are measured by using the above detector which does not have the resistor 20, the detection characteristics T1, T2, T3 are different from one another at most of the levels of the high-frequency signal as shown in FIG. 4, which reveals that the detection characteristic of the detector which does not have the resistor 20 has the temperature characteristic.

As described above, according to the detector of the first embodiment, since the detection characteristics in the wide range of the signal level do not have the temperature characteristics, it is possible to constantly accurately detect the high-frequency signal. Moreover, when this detector is applied to the envelope detector 58 of the transmission system shown in FIG. 5, it is possible to always control the transmission level to be constant even if the temperature is fluctuated, and it is possible to satisfactorily control the transmission level which is free from the influence of the temperature fluctuation. In particular, the application of the detector to the envelope detector 58 is preferable when the transmission signal level is largely fluctuated depending upon the temperature.

Figure 6:
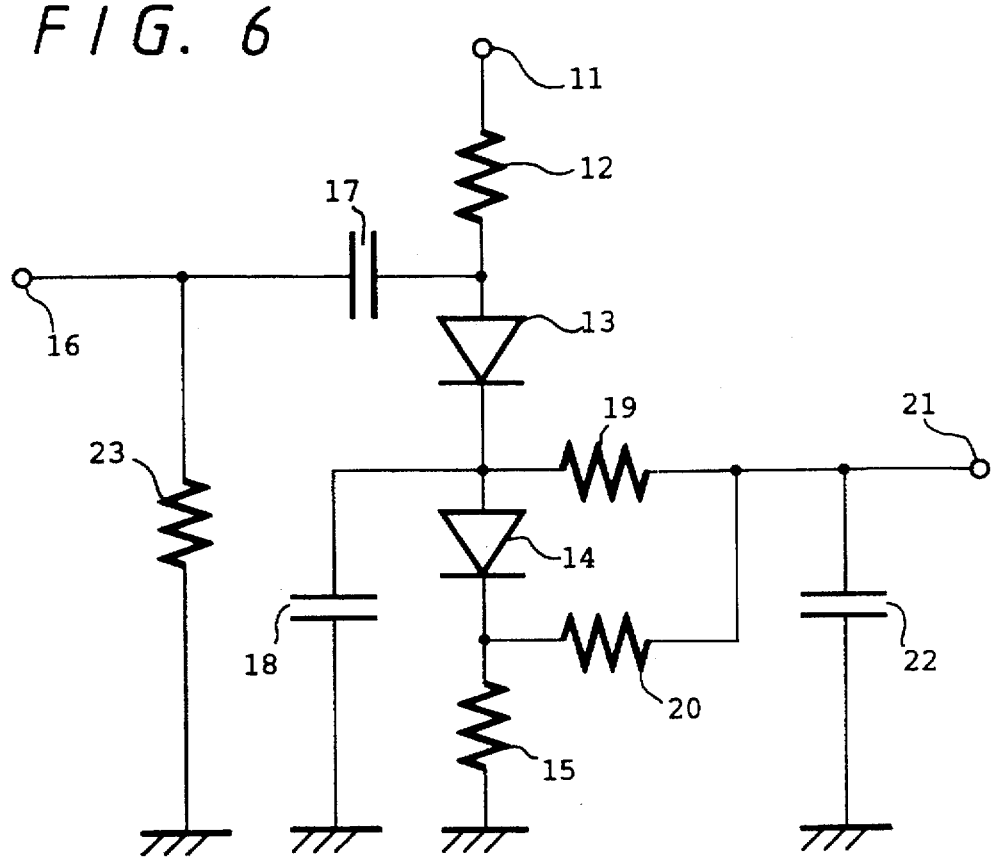
FIG. 6 is a diagram showing a circuit arrangement of a detector according to a second embodiment of the present invention.

A detector according to a second embodiment of the present invention will be described with reference to FIG. 6. In FIG. 6, parts and elements corresponding to those of the first embodiment shown in FIG. 2 are marked with the same reference numerals and will not be described in detail.

In the second embodiment, one end of a resistor 23 is connected to a junction point between the high-frequency signal input terminal 16 and the bypass capacitor 17, and the other end of the resistor 23 is grounded. Other portions of the detector according to the second embodiment are arranged similarly to those of the detector shown in FIG. 2.

According to the detector thus arranged, it is possible to achieve the effect similar to that of the detector according to the first embodiment, and further it is possible to reduce the impedance of the input terminal 16. Specifically, since an input impedance obtained when the resistor 23 is not provided is an inverse number of the conductance of the diode 13, the input impedance has a positive temperature coefficient and hence becomes a large input impedance (e.g., a value exceeding 50 Ω). When an impedance-matched state of an impedance of the high-frequency signal source and the input impedance is changed due to the temperature fluctuation, the detected output is consequently changed. Therefore, the resistor 23 is connected in order to reduce the change amount of the detected output, thereby the input impedance being lowered. This connection of the resistor 23 can reduce the influence of the change of the impedance of the diode 13 on the input impedance. As a result, it is possible to reduce the change of the detection voltage resulting from the change of the impedance of the diode 13 caused by the temperature fluctuation.

Figure 7:
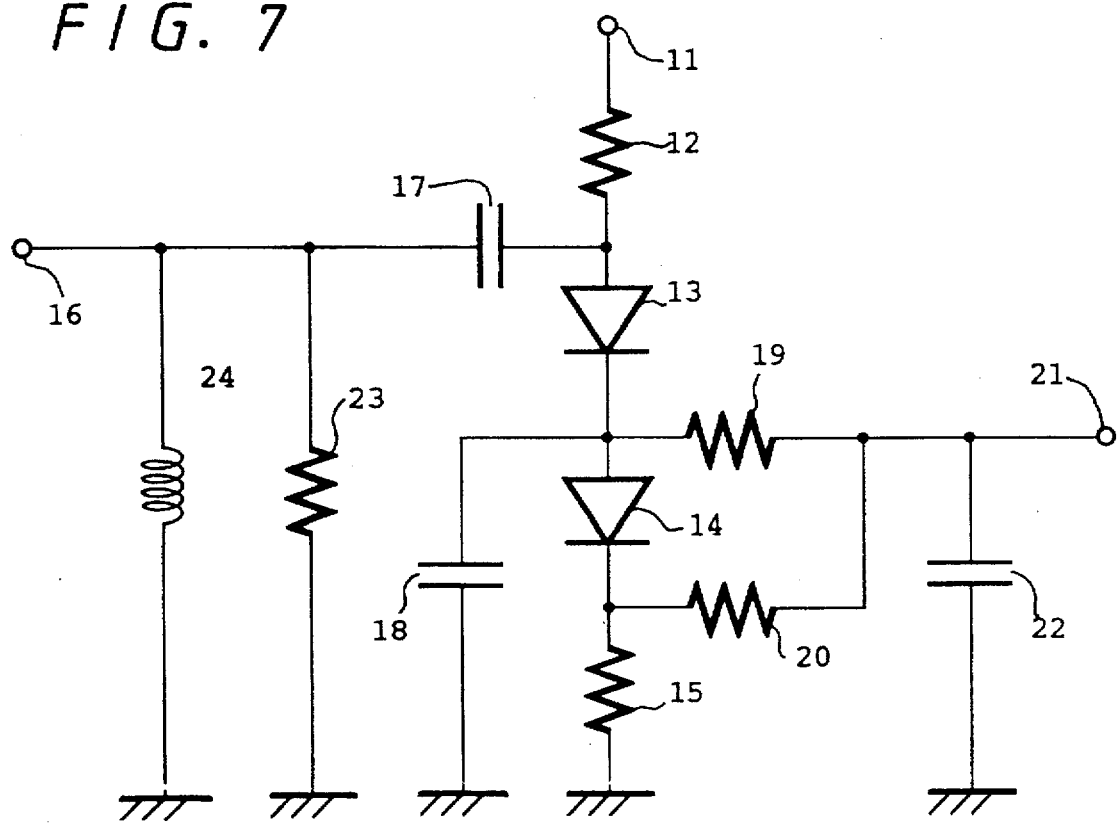
FIG. 7 is a diagram showing a circuit arrangement of a detector according to a third embodiment of the present invention.

A detector according to a third embodiment of the present invention will be described with reference to FIG. 7. In FIG. 7, parts and elements corresponding to those of the first and second embodiments shown in FIGS. 2 and 6 are marked with the same reference numerals and will not be described in detail.

In the third embodiment, one end of the resistor 23 is connected to the junction point between the high-frequency signal input terminal 16 and the bypass capacitor 17, and the other end of the resistor 23 is grounded. Moreover, one end of an inductance coil 24 is connected to the junction point between the input terminal 16 and the bypass capacitor 17, and the other end of the inductance coil 24 is grounded. Other portions of the detector according to the third embodiment are arranged similarly to those of the detector shown in FIG. 2.

According to the detector thus arranged, it is possible to achieve the effects similar to those of the detectors according to the first and second embodiments. Moreover, it is possible to make a frequency characteristic of the detection output flat. Specifically, if the inductance coil 24 is not provided, then since the circuit is arranged as if a junction capacitance of the diode 13 and an inverse number of the conductance of the diode 13 were connected in parallel, the input impedance becomes a capacitive complex impedance formed of a negative imaginary component and a positive real component. An impedance of a high-frequency signal source has a real value and hence cannot be matched with the input impedance, which permits the detection output to have a frequency characteristic.

When the inductance coil 24 is connected as described in the third embodiment, the inductance coil 24 has an inductive impedance which is a conjugate impedance of the capacitive complex impedance. The inductive impedance allows an impedance matching between the input impedance and the impedance of the high-frequency signal source around a certain frequency. A frequency selective characteristic is obtained around the frequency. Since the junction capacitance of the detection diode 13 generally has a small value, the capacitive impedance is high as compared with the impedance of the high-frequency signal source, which can provide a broad frequency selectivity. Accordingly, it is possible to make the frequency characteristics of the detection output flat.

Figure 8:
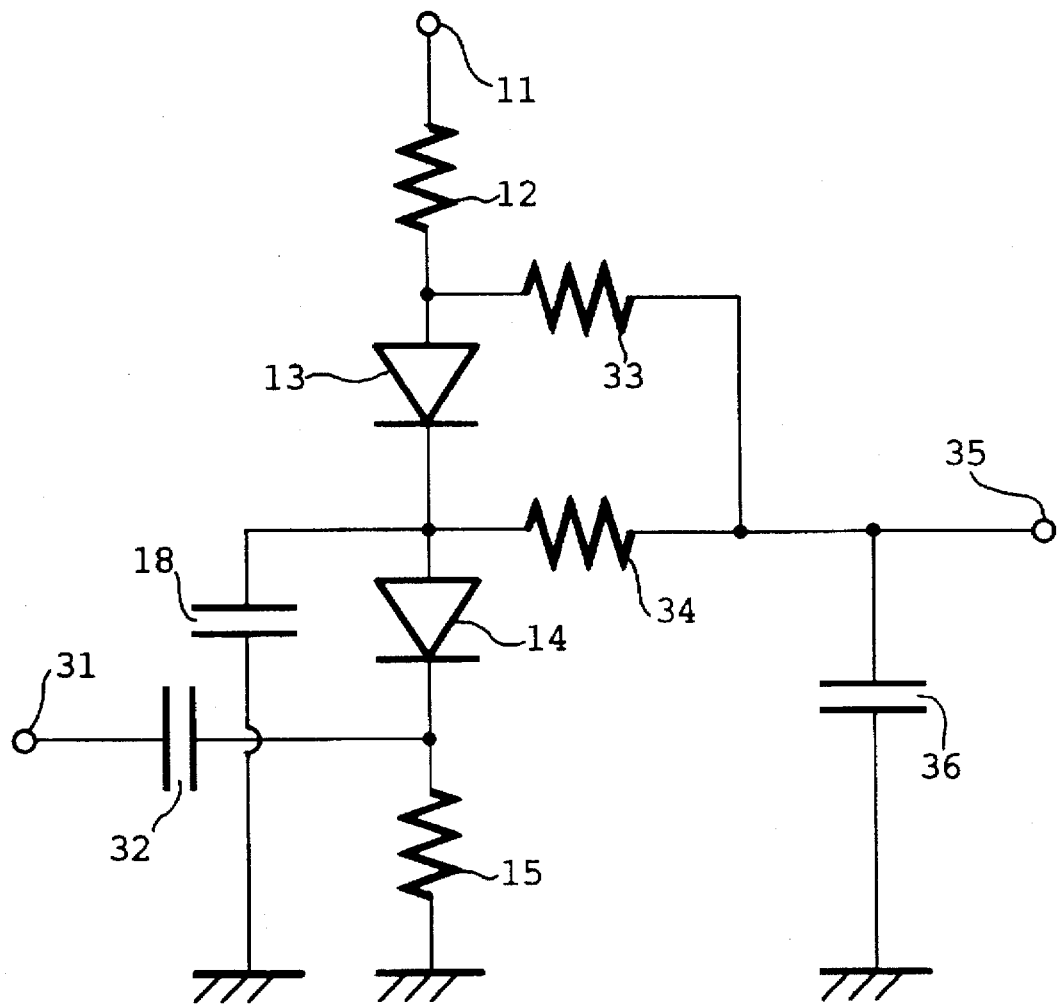
FIG. 8 is a diagram showing a circuit arrangement of a detector according to a fourth embodiment of the present invention.

A detector according to a fourth embodiment of the present invention will be described with reference to FIG. 8. In FIG. 8, parts and elements corresponding to those of the first embodiment shown in FIG. 2 are marked with the same reference numerals and will not be described in detail.

In the fourth embodiment, an high-frequency signal input terminal 31 is connected through a bypass capacitor 32 to a junction point between the diode 14 and the resistor 15, and the diode 14 carries out the detection operation. One end of a resistor 33 is connected to a junction point between the resistor 12 and the diode 13, and one end of a resistor 34 is connected to a junction point between the diode 13 and the diode 14. Specifically, a voltage is divided in response to resistance values of the resistors 33, 34, and divided voltage signals are derived from a detection-signal output terminal 35. One end of an integration capacitor 36 is connected to a junction point between the resistors 33, 34, and the other end of the capacitor 36 is grounded. A signal integrated by an integrator formed of the resistor 34 and the capacitor 36 is derived as an envelope detected signal from the output terminal 35. Other portions of the detector according to the fourth embodiment are similar to those of the detector shown in FIG. 2.

While in the fourth embodiment shown in FIG. 8 the diode 14 carries out the detection operation instead of the diode 13 carrying out the detection operation in the first to third embodiments, it is possible to obtain the detection characteristics having no temperature characteristic similarly to the first to third embodiments. In the fourth embodiment, it is possible to improve the detection characteristics by connecting both or either of the resistor and the inductance circuit respectively shown in FIGS. 6 and 7 to an input portion of the high-frequency signal.

While the detector according to the present invention is applied to the transmitter for controlling the transmission output based on the detected signal in each of the first to fourth embodiments, the present invention is not limited thereto. It is needless to say that the present invention can be applied to a high-frequency signal detector used for other applications.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A detector, comprising:

a circuit formed of a first resistor, a first diode, a second diode having characteristics substantially equal to characteristics of said first diode, and a second resistor connected in series and to ground, wherein said circuit is supplied with a predetermined bias voltage;

means for inputting a high-frequency signal to a junction point between said first resistor and said first diode;

a third resistor and a fourth resistor respectively connected to both ends of said second diode; and means for deriving an output signal from a junction point between said third resistor and said fourth resistor.

2. A The detector according to claim 1, further comprising an impedance circuit wherein said junction point between said first resistor and said first diode input with said high-frequency signal is connected to ground through said impedance circuit.

3. The detector according to claim 2, wherein said impedance circuit includes an inductance circuit.

4. A detector, comprising:

a circuit having a first resistor, a first diode, a second diode having characteristics substantially equal to characteristics of said first diode, and a second resistor connected in series and to ground, wherein said circuit is supplied with a predetermined bias voltage;

means for inputting a high-frequency signal to a junction point between said second diode and said second resistor;

a third resistor and a fourth resistor respectively connected to both ends of said first diode; and means for deriving an output signal from a junction point between said third resistor and said fourth resistor.

5. The detector according to claim 4, further comprising an impedance circuit, wherein said junction point between said second diode and said second resistor input with said high-frequency signal is connected to ground through said impedance circuit.

6. The detector according to claim 5, wherein said impedance circuit includes an inductance circuit.

7. A transmitter, comprising:

an amplifier circuit for amplifying a transmission signal;

a detector connected to said amplifier circuit for monitoring a level of said transmission signal amplified by said amplifier circuit and producing a detected signal; and a control circuit connected to said amplifier circuit and said detector for controlling said amplifier based on said detected signal produced by said detector, wherein said detector includes a circuit having a first resistor, a first diode, a second diode having characteristics substantially equal to characteristics of said first diode, and a second resistor connected in series and to ground, wherein said circuit is supplied with a predetermined bias voltage, means for inputting said transmission signal to a junction point between said first resistor and said first diode, a third resistor and a fourth resistor respectively connected to both ends of said second diode, and means for deriving said detected signal from a junction point between said third resistor and said fourth resistor.

8. A transmitter, comprising:

an amplifier circuit for amplifying a transmission signal;

a detector connected to said amplifier circuit for monitoring a level of said transmission signal amplified by said amplifier circuit and producing a detected signal; and a control circuit connected to said amplifier circuit and said detector for controlling said amplifier based on said detected signal produced by said detector, wherein said detector includes a circuit having a first resistor, a first diode, a second diode having characteristics substantially equal to characteristics of said first diode, and a second resistor connected in series and to ground, wherein said circuit is supplied with a predetermined bias voltage, means for inputting said transmission signal to a junction point between said second diode and said second resistor, a third resistor and a fourth resistor respectively connected to both ends of said first diode, and means for deriving said detected signal from a junction point between said third resistor and said fourth resistor.

* * * * *